May 7, 1968 L. F. MAYLE 3,382,442

SEARCH TUNER FOR AM-FM RADIO RECEIVERS

Filed Sept. 14, 1964

2 Sheets-Sheet 1

INVENTOR.
Louis F. Mayle

BY

Lockwood, Woodard, Smith & Weikart
Attorneys

May 7, 1968 L. F. MAYLE 3,382,442

SEARCH TUNER FOR AM-FM RADIO RECEIVERS

Filed Sept. 14, 1964 2 Sheets-Sheet 2

INVENTOR.
Louis F. Mayle
BY
Lockwood, Woodard, Smith & Weikart
Attorneys 3,382,442

SEARCH TUNER FOR AM-FM RADIO RECEIVERS

Louis F. Mayle, Fort Wayne, Ind., assignor to The Magnavox Company, Fort Wayne, Ind., a corporation of Indiana Filed Sept. 14, 1964, Ser. No. 396,256
18 Claims. (Cl. 325—470)

ABSTRACT OF THE DISCLOSURE

A search-tune system with a normally closed electrically operable tuner motor stopping switch in a tuner motor hold circuit. A stop switch operating coil in series with a normally quiescent transistor. Another transistor with two tuned circuits at its input, one tuned to the AM intermediate frequency and the other tuned to the FM intermediate frequency, both being coupled to an I-F signal source of the receiver, peaking of a signal in either circuit upon proper tuning of an adequate signal causing an output from this transistor to the transistor in series with the motor stopping switch coil to cause conduction therein, opening the switch and stopping the tuner motor. Additional tank circuits are provided at the base of this latter translator to aid in this function.

*Background of the invention*

This invention relates generally to search-tuning or signal-seeking circuitry for radio receivers, and more particularly to search-tune circuitry applicable to any AM, FM or AM/FM radio.

A variety of search-tune circuits is known for radio receivers. Many have certain undesirable characteristics including complexity, cost, and poor performance, the latter including failure to tune accurately and inability to distinguish between stations where acceptable signals are being received and those where the signals are not acceptable.

It is therefore a general object of the present invention to provide improved search tune circuitry for radio receivers.

A further object is to provide search-tuning circuitry useful with both AM and FM receivers.

A still further object is to provide a search tuner which can turn in either direction and will stop only at stations from which signals are being received which are above a certain threshold level, which level can be easily established in advance by the user.

A still further object is to provide circuitry achieving the foregoing objects with simple, reliable, and inexpensive compact construction.

Described briefly, a typical embodiment of the present invention employs a tuner drive motor with offset rotor, the motor having a starting circuit and holding circuit, the starting circuit including a momentary contact switch to start the tuning operation, and the holding circuit including a normally closed electrically operated motor stopping switch which, when opened, stops the tuner motor. The search tuning action is started by momentary closure of the motor start switch. It is stopped by the momentary opening of the electrically operated motor stopping switch at the proper time.

To open the electrically operated motor stopping switch, an operating coil is provided in a series circuit with a direct current source of electrical energy and a normally quiescent first transistor. A second transistor is provided with its collector connected to the base of the first transistor and its emitter coupled to an AGC voltage source in the radio receiver.

For each of the two transistors, there is a pair of high-Q tank circuits coupled to the base of the transistor, one of the tank circuits being resonant at a predetermined intermediate frequency for FM, and the other tank circuit being resonant at a predetermined intermediate frequency for AM. These two sets of tank circuits are, in effect, cascaded so as to provide a very selective current "spike" at "center" AM or FM I-F. An input to the tank circuits coupled to the second transistor is obtained from a high-level I-F source in the radio receiver.

Means are provided to assure that the second transistor, and therefore the first transistor, remains cut off unless the AGC signal in the receiver has at least a predetermined minimum value. This minimum value is established by a manually adjustable potentiometer which is the sensitivity control for the circuitry.

If after the searching is started by momentary closure of the motor start switch, the "center" I-F frequency of a station producing signals in the receiver of adequate strength, is approached, the approaching resonance of the tank circuits coupled to the second transistor causes the A-C collector current of this transistor to increase whereupon the signal thus applied to the corresponding tank circuit coupled to the first transistor causes the current in the corresponding tank circuit to increase. The result is that the increased A.C. in the coupling loop, or coil turns, between emitter and base is rectified by the emitter-base junction of the first transistor, producing a pulsating D.C. in the collector circuit. The A-C component of the pulsating D.C. is by-passed by the capacitor shunting the emitter and collector, leaving only the D-C component in the operating coil. When the "pull-in" current value in the operating coil for the first transistor has been reached, the electrically operated switch will be opened to de-energize the tuner drive motor.

The full nature of the invention will be understood from the accompanying drawings and the following description and claims.

Figure 1:
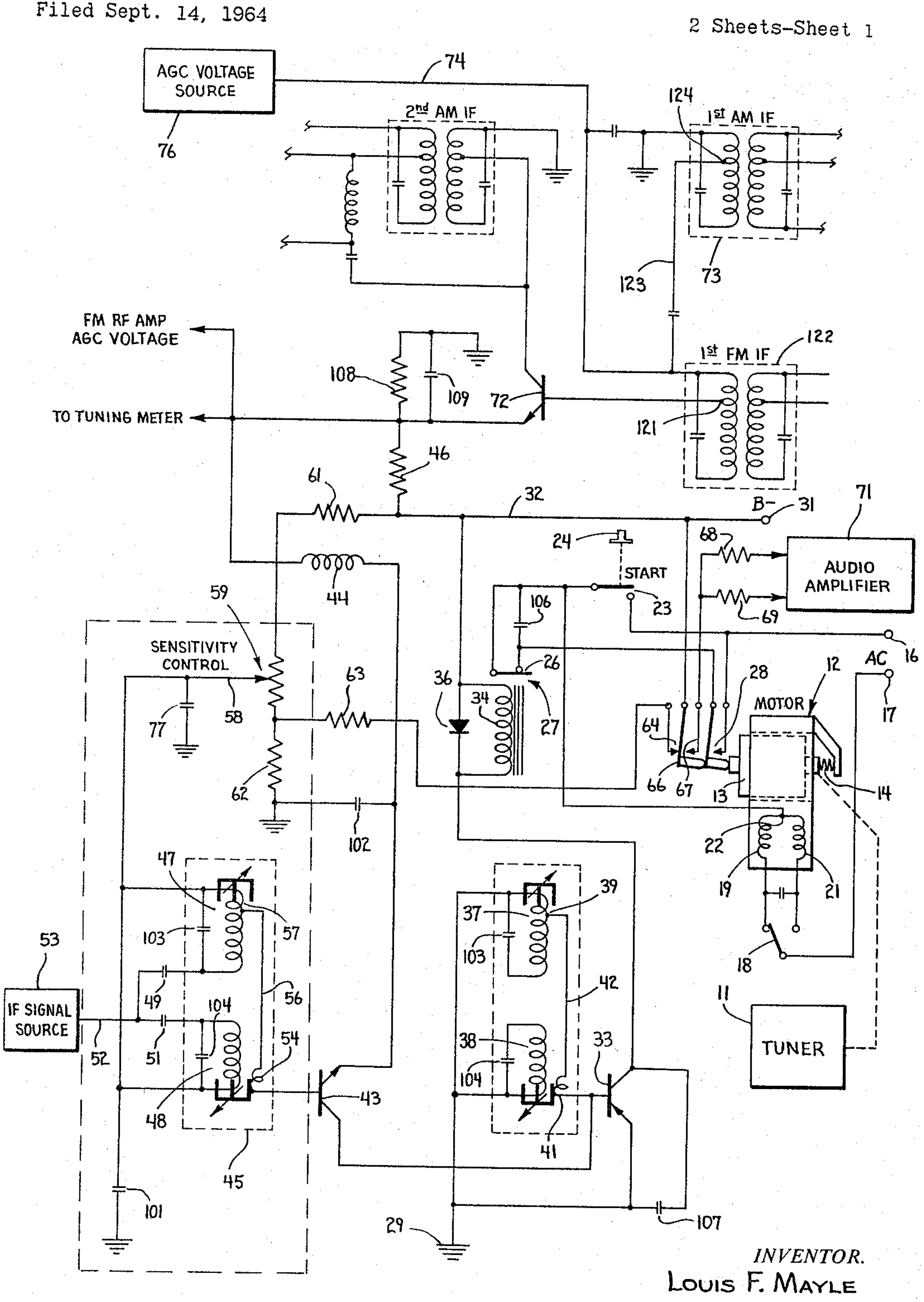
FIG. 1 is an electrical diagram, partially in block and partially in schematic form, illustrating the typical embodiment of the present invention.

Referring now to the drawings in detail, the radio receiver incorporates an AM/FM tuner 11 connected to a tuner drive motor 12 having a rotor 13 which is normally offset as shown when the motor is not energized. Motors of this type are well known and it is typical practice to employ a spring 14 or other biasing means to keep the rotor offset until the motor is energized. To drive the motor, a source of alternating current electrical energy is applied across the terminals 16 and 17, with the terminal 17 being connected through the reversing switch 18 to one or the other of the motor windings 19 and 21. From the top end 22 of these windings a motor starting circuit includes the normally open motor starting switch 23 which is connected back to the supply terminal 16. This motor starting switch is a momentary contact type of switch and may be closed directly by a manual push-button 24 or by remote control means, if desired.

A motor holding circuit is provided from the junction 22 through the normally closed contacts 26 of the electrically operated motor stopping switch 27 and through the normally open contacts 28 of the rotor-operated motor "hold" switch to the terminal 16. When the motor is energized by closure of the start switch, the rotor is pulled into alignment with the stator and the switch contacts 28 close to complete the motor holding circuit until the electrically operated switch contacts 26 are opened.

A source of direct current electrical energy is connected between the ground 29 and terminal 31 to provide a negative direct current potential on terminal 31 and the D-C bus 32 connected to it. Typically a 23-volt negative potential is applied at this point.

A PNP transistor 33 is provided with its emitter connected to ground 29 and its collector connected to the lower end of operating coil 34 for the motor stopping relay 27, the upper end of the coil being connected to the D-C bus 32. Diode 36 is connected in shunt with coil 34 to prevent damage to transistor 33 when current flow therethrough is interrupted. Usually it is desirable that transistor 33 be a germanium unit because of its lower "shelf" voltage.

A set of high-Q tank circuits 37 and 38 is coupled to the base of transistor 33. Tank circuit 37 is resonant at 455 kc., and tapped at 39, ten turns from the end, for the current take-off. Tank circuit 37 is resonant at 10.7 mc. and a separate three or four turn winding 41 is coupled to the 10.7 mc. tank coil to provide the current take-off. So it is seen that current take-off from either of the tank circuits to the base of transistor 33 is obtained through the winding 41 from tank circuit 38 (for FM) or through the conductor 42 and winding 41 from the tank circuit 37 (for AM). Because one end of tank coil 37 is connected to ground 29, as is the emitter of transistor 33, the emitter-base junction of transistor 33 is effectively shorted through the low resistances of coil 41 and the tapped end of tank coil 37 so that the transistor is normally quiescent and the contacts of relay switch 27 remain closed.

Transistor 43, which is of the NPN type, is provided with its collector connected to the base of transistor 33 and with its emitter connected to the choke coil 44. Choke 44 is returned to the junction of resistors 46 and 108 which are a voltage divider between the D-C bus 32 and ground. This transistor also has a set of tank circuits 47 and 48 coupled to the base thereof in the same manner as the tank circuits 37 and 38 are coupled to the base of transistor 33. Tank circuit 47 is resonant at 455 kc. and tank circuit 48 is resonant at 10.7 mc. Small capacitors 49 and 51 couple these tank circuits through conductor 52 to a high-level I-F signal source 53 in the radio receiver.

The base of transistor 43 is D-C coupled through the winding 54, conductor 56 and a portion 57 of the coil in tank circuit 47 to the movable arm 58 of the sensitivity control potentiometer 59. This potentiometer together with resistors 61 and 62 forms an adjustable voltage divider between the D-C bus 32 and ground. A resistor 63 is connected from the junction of potentiometer 59 and resistor 62 to normally closed contacts 64 of the rotor-operated switch, the movable member of these contacts being connected to the D-C bus 32 whereby resistor 63 is placed in shunt with the potentiometer 59 and resistor 61 when the motor is not energized.

At this point it may also be mentioned that the movable contactor 66 of the rotor operated switch is engageable with a fixed contactor 67 threof, the latter being connected through resistors 68 and 69 to audio amplifiers 71 in the radio receiver. This is for muting the audio amplifiers when the motor is energized and searching is in progress.

Another feature of the invention is the connection of the choke 44 not only to the resistor 46 but also to the emitter of the I-F amplifier transistor 72 of the radio receiver. The base of this transistor is connected to the tap 121 on 1st FM I-F transformer 122, and through conductor 74 to an AGC voltage source 76 in the receiver. In this way, the AGC voltage level is enabled to affect conduction in transistor 43 during the searching operation.

*Operation*

Assuming that the radio receiver is tuned to a station, and it is desired to change stations, it is only necessary to push the start button 24 or otherwise close the switch 23 momentarily. Before this switch is closed, the rotor is offset as shown and the switch contacts 64 are closed placing the resistor 63 in shunt with potentiometer 59 and resistor 61. This biases transistor 43 so that cut-off is assured even though there may be resonant conditions in one or the other of the tank circuits 47 and 48. Because of this, transistor 33 is also cut-off and there is no current flow through the coil 34. Electrically operated switch 26 remains in its normally closed condition.

Then the start switch 23 is closed. The motor is immediately energized whereupon the rotor thereof moves into alignment with the stator opening the switch contacts 64 and closing the contact 66 with the muting contact 67. Alignment of the rotor also closes the contacts 28 in the motor holding circuit so that the motor will remain energized even though switch 23 reopens immediately.

The opening of contacts 64 removes resistors 63 from shunt with potentiometer 59 and resistor 61 whereupon the transistor 43 would become forward biased. However the time constant of capacitor 77 and the voltage divider resistance delays activation of transistor 43 until the tuner motor has driven the tuner off the station to which it was tuned immediately prior to the closing of the start switch 23. Then transistor 43 is activated.

As the tuner passes through various carriers, it will reach one where the signal strength is such that the AGC voltage in the receiver will cause the negative emitter voltage of transistor 43 to be numerically greater than the sum of the emitter-base contact potential of transistor 43 and the negative voltage applied to the base of transistor 43 by reason of the adjustment of the arm 58 of the potentiometer 59. In this event transistor 43 will become forward biased and, when the I-F reaches "center" frequency to which either of the tank circuits is resonant, the rectified alternating current in the emitter-base circuit of transistor 33 will render this transistor sufficiently conductive that the collector current therein will reach the "pull-in" value and actuate the relay 27 to open the motor stopping switch contacts 27. The motor will then be de-energized whereupon the tuner will stop and the contacts 28 again reopen. The muting switch contacts, which were closed during searching are also opened to return the audio amplifiers to normal operation. The switch contacts 64 are again closed to place resistor 63 in shunt and turn off transistor 43. When transistor 43 is turned off, so is transistor 33, because amplification of the I-F carrier frequency can no longer occur in transistor 43.

In the illustrated example, the transistor employed to apply the AGC voltage to the transistor 43 is an I-F amplifier with AGC voltage applied to its base. From the direct current standpoint, this amplifier circuit is an emitter follower and, as the base becomes more negative with increased AGC signal strength the emitted voltage also becomes more negative. In the illustrated example, from a condition of no AGC signal to a condition of maximum signal strength, the emitter voltage varies from about minus thirteen volts to about minus sixteen volts. Therefore, if the arm of the sensitivity control potentiometer 59 is set so that during searching, the base of transistor 43 is at minus fourteen volts, transistor 43 will remain quiescent while passing through carriers whose signal strength is such as to produce a voltage at the emitter of transistor 43 which is numerically less than fourteen volts plus the emitter-base contact potential of transistor 43. However, when passing into a carrier whose signal strength causes the emitter voltage of transistor 43 to be numerically greater than fourteen volts plus the emitter-base contact potential of the transistor, the transistor will be activated to activate the relay as just described. Thus, by adjustment of potentiometer 59, the search circuitry will stop the tuner on all carriers in the band or on only the stronger carriers.

Figures 2, 3:
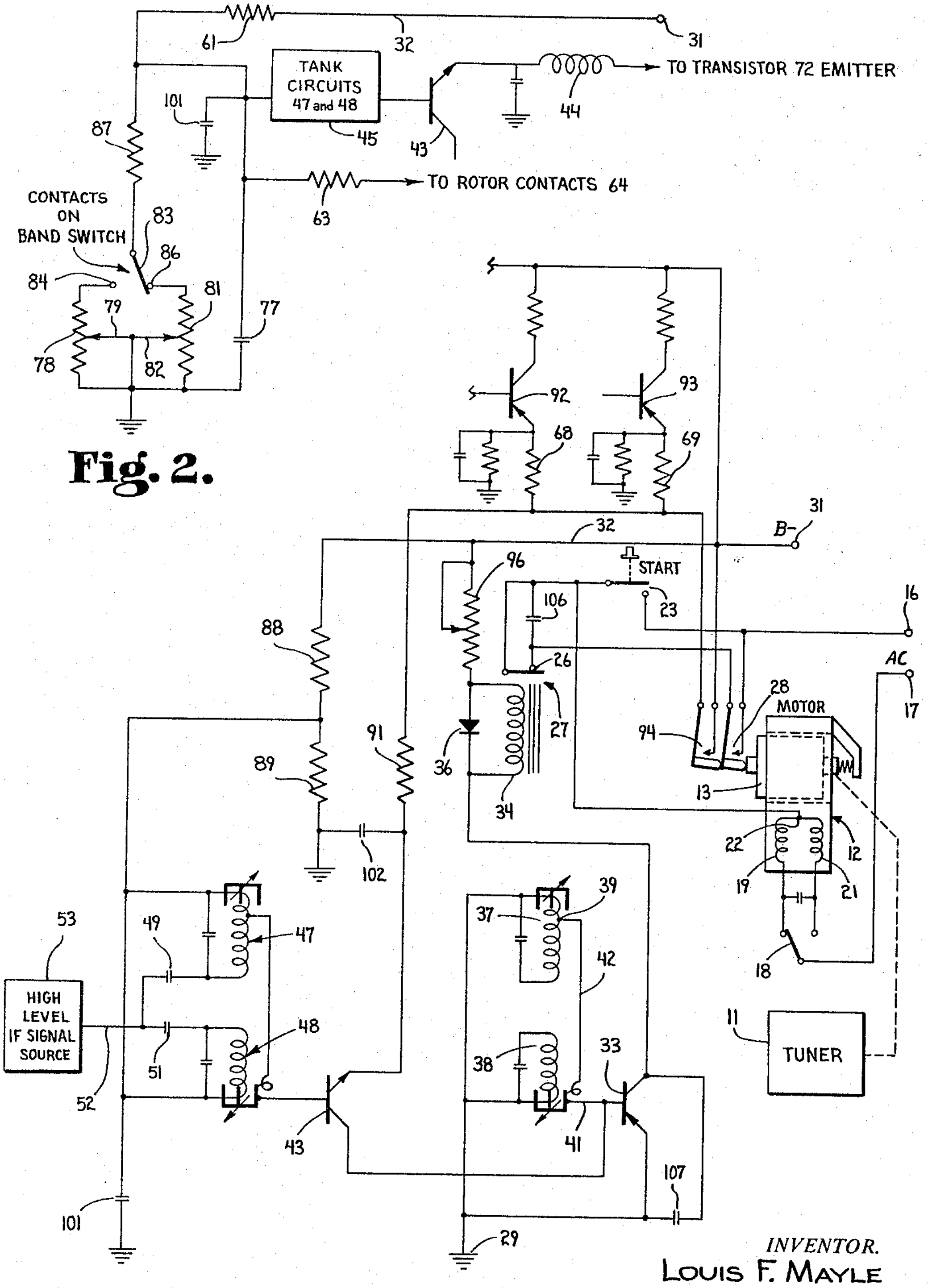
FIG. 2 is a schematic diagram of a variation in components applicable for sensitivity control on AM/FM radios.
FIG. 3 is a schematic diagram of search tuner circuitry incorporating features of the present invention but omitting the employment of AGC voltage.

If it is desired that the same sensitivity control setting not be applicable to both the AM and FM bands on an AM/FM radio, the arrangement shown in FIG. 2 can be employed. In this example, a potentiometer 78 with the movable arm 79 is provided for the AM sensitivity control, and a potentiometer 81 with the movable arm 82 is provided for the FM sensitivity control. The band switch of the receiver has a movable contactor 83 and a fixed contact 84 and fixed contact 86. This movable contactor is connected through resistor 87 and resistor 61 to the DC bus 32. The position of the band switch determines which of the sensitivity control potentiometers is effective to control sensitivity of the search-tune circuitry. The tank circuits 47 and 48 are shown in a block 45 and are connected to the transistor 43 and to the I-F signal input in the same manner as in FIG. 1.

It has been found that a resistor may be substituted in place of the choke 44. However, a choke has been found to provide better accuracy in determining the signal threshold level.

An important advantage of the sensitivity control of this invention as described hereinabove is the fact that transistors 43 and 33 need not be selected for gain limits, nor will degenerative circuitry have to be provided to compensate for a wide variation of gain. With transistors checked for minimum gain, the setting of the sensitivity control will automatically compensate for excessive transistor gain.

FIG. 3 shows another search-tune circuit incorporating features of the present invention but having some variations. Where components are identical to those in FIG. 1, the same reference numerals are employed.

In the example of FIG. 3, there is no rheostat or potentiometer in the base circuit of transistor 43. Instead, a D-C potential is estabilshed on the base of transistor 43 by the voltage divider consisting of resistors 88 and 89, the lower end of resistor 89 being grounded and the upper end of resistor 88 being connected to the D-C bus 32. Typically, a ten volt negative potential is thereby established at the base of transistor 43.

The emitter of transistor 43 is connected through resistor 91 and resistors 68 and 69 to the emitters of audio amplifier transistors 92 and 93 of the radio receiver. These emitters are normally maintained at a seven volt negative potential by conventional circuitry not shown in the drawings and, because the base is at a ten volt negative potential, the transistor 43 is normally quiescent. Accordingly, transistor 33 is also normally quiescent.

As soon as the motor start switch is closed and the motor starts, the normally open rotor-actuated switch 94 closes whereby the D-C bus 32 is connected to the upper end of resistor 91, forward biasing transistor 43 into conduction. The application of the negative potential from D-C bus 32 through the switch 94 to the lower ends of resistors 68 and 69 turns off transistors 92 and 93 of the audio amplifier, thereby muting the amplifier.

With transistor 43 conducting, as the tuner drive motor is operating, either of the two I-F frequencies to which tank circuits 47 and 48 are resonant will cause an increase of collector current in transistor 33. In this instance, however, the sensitivity control is provided by way of the rheostat 96 between the upper end of coil 34 and D-C bus 32. Therefore, whenever the collector current achieves the "pull-in" value, the motor stopping switch 26 of the relay will be opened to stop the tuner motor. In this instance, the rheostat 96 provides the sensitivity control for the circuit, and its effectiveness varies inversely to the flatness of the AGC characteristic of the radio receiver. In other words, the flatter the characteristic, the less effective will be the sensitiviy control.

It was mentioned above that a germanium transistor is preferable for transistor 33 because it has a lower "shelf" voltage than a silicon transistor. This means that while the tuner is searching, and the approaching resonance of the tank circuit connected to the base of transistor 33 causes the impedance across its current winding to increase and divert more A-C current through the emitter-base diode of transistor 33, less voltage across the current winding of the tank circuit is needed to produce the same value of rectified base current in transistor 33 than would be required if it were a silicon transistor. This means that less A-C collector current from current amplifier transistor 43 is needed to produce the same value of rectified current in transistor 33.

The circuitry of the present invention has been employed very successfully with the Magnavox R201-05 radio, but is applicable to any AM, FM or AM/FM radio. Examples of component values which have been successfully employed in the circuit of FIG. 1 are as follows:

| | | |
|---|---|---|
| PNP transistor **33** (RCA) | | 2N1637 |
| NPN transistor **43** (Magnavox) | | 41N1 |
| NPN transistor **72** (Magnavox) | | 41N1 |
| Resistor **61** | ohms | 15,000 |
| Potentiometer **59** | do | 15,000 |
| Resistors **62** and **63** | do | 33,000 |
| Capacitor **77** | μf | 5 |
| Capacitor **49** | pf | 1.2 |
| Capacitor **51** | pf | 0.22 |
| Capacitors **101, 102, 107** | μf | .05 |
| Choke **44** | μh | 500 |
| Capacitors **103** | pf | 91 |
| Capacitors **104** | pf | 27 |
| Relay coil **34** | ohms | 2500 |
| Capacitor **106** | μf | 0.1 |
| Resistors **68** and **69** | ohms | 5600 |
| Resistor **46** | do | 680 |
| Resistor **108** | do | 6800 |
| Capacitor **109** | μf | 0.1 |

Values of components in FIG. 3 which are different from those in FIG. 1.

| | | |
|---|---|---|
| Resistor **88** | ohms | 47,000 |
| Resistor **89** | do | 39,000 |
| Resistor **91** | do | 5600 |
| Rheostat **96** | do | 5000 |

While the invention has been disclosed and described in some detail in the drawings and foregoing description, they are to be considered as illustrative and not restrictive in character, as other modifications may readily suggest themselves to persons skilled in this art and within the broad scope of the invention, reference being had to the appended claims.

The invention claimed is:

1. A search-tune system for radio receivers, said system comprising:

a reversible tuner drive motor coupled to the tuner of a radio receiver, said motor having a rotor normally biased into an offset position with respect to a stator, said motor having a winding which, when energized, pulls said rotor into a second position in said stator and drives said rotor to rotate the radio tuner;

a motor starting circuit including in series a source of electrical energy, a normally open starting switch, a reversing switch and said winding;

a motor holding circuit including in series said energy source, said winding, a first normally closed electrically operated motor stopping switch, and a normally open rotor operated drive motor holding switch;

an operating coil for said motor stopping switch, said coil being operable, when sufficiently energized, to open said stopping switch and thereby de-energize said motor to stop drive of the tuner;

a stopping switch control circuit including in series a source of direct current electrical energy, said operating coil, and the collector-emitter path of a first transistor;

means connected in parallel with the emitter-base path of said first transistor, said means having low resistance to steady direct current, whereby said first transistor is normally non-conducting;

a control circuit for said first transistor and including in series, the emitter-base path of said first transistor, the collector-emitter path of a second transistor having output means, a choke, and a source of AGC voltage in the radio receiver;

adjustable biasing mans coupled to the base of said second transistor, said biasing means including said source of electrical energy and an adjustable voltage divider coupled to said source and to the base electrode of said second transistor, said voltage divider being adjustable to maintain said second transistor non-conducting during energization of said motor until the AGC voltage coupled to the emitter of said second transistor exceeds a predetermined value, to prevent conduction in said first transistor until said AGC voltage exceeds a predetermined value, to thereby provide a sensitivity control;

first (47) and second (48) high-Q tank circuits having input means coupled to a high level FM and AM intermediate frequency signal source in said radio receiver and having output means coupled to the base of said second transistor, said first tank circuit being resonant at a first predetermined FM intermediate frequency and said second tank circuit being resonant at a second predetermined AM intermediate frequency, one of said first and second tank circuits, when resonant, greatly increasing the alternating current amplified by said second transistor and produced at its said output means when the AGC voltage exceeds a predetermined level, third (37) and fourth (38) high-Q tank circuits coupled to the collector of said second transistor and to the base of said first transistor (33), said third tank circuit being resonant at said first frequency, and said fourth tank circuit being resonant at said second frequency, one of said third and fourth tank circuits being effective, when resonant, to increase rectified alternating current in the emitter-base circuit of said first transistor and thereby enable said first transistor to conduct current in its emitter-collector path sufficient to energize said operating coil to open said electrically operated switch and stop said motor.

2. The system as set forth in claim 1 wherein:

the series combination of a second normally closed rotor-operated switch and a first resistance is connected in shunt with a portion of said voltage divider to insure that said second transistor is biased to cut-off when said motor is de-energized, said second normally closed switch being opened upon energization of said motor to enable conduction in said second transistor when said AGC voltage exceeds said predetermined value.

3. The system as set forth in claim 1 wherein:

a first capacitor is coupled to said voltage divider, and the time constant of the combination of said first capacitor and said voltage divider prevents immediate forward biasing of said second transistor when said motor is energized.

4. The system as set forth in claim 1 wherein:

said adjustable voltage divider includes first and second potentiometers of different values, one potentiometer being adjustable to bias said second transistor to give desired sensitivity for FM band tuning, and the other potentiometer being adjustable to bias said second transistor to give desired sensitivity for AM band tuning, and a selector switch is coupled to the band switch of said receiver, said selector switch having a first position enabling said first potentiometer in said voltage divider and disabling said second potentiometer when said band switch is in position for FM reception, and said selector switch having a second position enabling said second potentiometer in said voltage divider and disabling said first potentiometer when said band switch is in position for AM reception.

5. The system as set forth in claim 1 wherein:

a second normally open rotor-operated switch is coupled between said direct current energy and audio amplifier means of said radio receiver, said second normally open rotor-operated switch closing upon energization of said motor to disable said audio amplifier means and mute the radio receiver while said motor is energized.

6. A search-tune system for radio receivers, said system comprising:

a tuner drive motor coupled to the tuner of a radio reeciver to drive the radio tuner;

a motor starting circuit including in series a source of electrical energy, a normally open starting switch, and said motor;

a motor holding circuit including in series said energy source, said motor, and a first normally closed electrically operated motor stopping switch, and a normally open drive motor holding switch;

an operating coil for said motor stopping switch, said coil being operable, when sufficiently energized, to open said stopping switch and de-energize said motor to stop drive of the tuner;

a stopping switch control circuit including in series a second source of electrical energy, said operating coil, and the collector-emitter path of a first transistor;

a control circuit for said first transistor and including in series the emitter-base path of said first transistor, the collector-emitter path of a second transistor, a first impedance means, and a source of AGC voltage in the radio receiver;

biasing means coupled to the base of said second transistor, said biasing means including said second source of electrical energy and voltage divider means coupled to said second source and to the base electrode of said second transistor, said voltage divider means being adjustable to maintain said second transistor non-conducting during energization of said motor until the AGC voltage coupled to the emitter of said second transistor exceeds a predetermined value, to prevent conduction in said first transistor until said AGC voltage exceeds a predetermined value, to thereby provide a sensitivity control;

first (47) and second (48) tank circuits having input means coupled to a high level intermediate frequency signal source in said radio receiver, and having output means coupled to the base of said second transistor, said first tank circuit being resonant at a first predetermined FM intermediate frequency and said second tank circuit being resonant at a second predetrmined AM intermediate frequency, one of said first and second tank circuits, when resonant, greatly increasing the alternating current amplified by said second transistor when the AGC voltage exceeds a predetermined levels;

third (37) and fourth (38) tank circuits coupled to the collector of said second transistor and to the base of said first transistor, said third tank circuit being resonant at said first frequency, and said fourth tank circuit being resonant at said second frequency, one of said tank circuit being effective, when resonant, to increase the rectified alternating current in the emitter-base circuit of said first transistor and thereby enable said first transistor to conduct current in its emitter-collector path sufficient to energize said operating coil to open said electrically operated switch and stop said motor.

7. A search-tune system for radio receivers, said system comprising:

a tuner drive motor coupled to the tuner of a radio receiver to drive the radio tuner;

a motor starting circuit including in series a source of electrical energy, a normally open starting switch, and said motor;

a motor holding circuit including in series said energy source, said motor, and a first normally closed electrically operated motor stopping switch, and a normally open drive motor holding switch;

an operator for said motor stopping switch, said operator being operable, when sufficiently energized, to open said stopping switch for de-energizing said motor to stop drive of the tuner;

a stopping switch control circuit including in series a second source of electrical energy, said operator, and the collector-emitter path of a first transistor;

a control circuit for said first transistor and including in series, the emitter-base path of said first transistor, the collector-emitter path of a second transistor, a first impedance means;

biasing means coupled to said second transistor, said biasing means including said second source of electrical energy and voltage divider means coupled to said second source and to the base electrode of said second transistor, and said biasing means including means maintaining said second transistor nonconducting when said motor is de-energized to prevent conduction in said first transistor when said motor is de-energized;

first and second tank circuits having input means coupled to an intermediate frequency signal source in said radio receiver and having output means coupled to the base of said second transistor, said first tank circuit being resonant at a first predetermined FM intermediate frequency and said second tank circuit being resonant at a second predetermined AM intermediate frequency, one of said first and second tank circuits, when resonant, greatly increasing the alternating current ampiified by said second transistor when said motor is energized;

third and fourth tank circuits coupled to the collector of said second transistor and to the base of said first transistor, said third tank circuit being resonant at said first frequency, and said fourth tank circuit being resonant at said second frequency, one of said tank circuits being effective, when resonant, to increase the rectified-alternating current in the emitter-base circuit of said first transistor and thereby enable said first transistor to conduct current in its emitter-collector path sufficient to energize said operator to open said electrically operated switch and stop said motor.

8. A search-tune system for radio receivers, said system comprising:

a tuner drive motor coupled to the tuner of a radio receiver to drive the radio tuner;

a motor starting circuit including in series a source of electrical energy, a normally open starting switch, and said motor;

a motor holding circuit including in series said energy source, said motor, and a first normally closed electrically operated motor stopping switch, and a normally open drive motor holding switch;

an operator for said motor stopping switch, said operator being operable, when sufficiently energized, to open said stopping switch for de-energizing said motor to stop drive of the tuner;

a stopping switch control circuit including in series a second source of electrical energy, said operator, and the collector-emitter path of a first transistor;

a control circuit for said first transistor and including in series, the emitter-base path of said first transistor, the collector-emitter path of a second transistor, a first impedance means;

biasing means coupled to said second transistor, said biasing means including said second source of electrical energy and voltage divider means coupled to said second source and to the base electrode of said second transistor;

first and second tank circuits having input means coupled to an intermediate frequency signal source in said radio receiver and having output means coupled to the base of said second transistor, said first tank circuit being resonant at a first predetermined FM intermediate frequency and said second tank circuit being resonant at a second predetermined AM intermediate frequency, one of said first and second tank circuits, when resonant, greatly increasing the alternating current amplified by said second transistor;

third and fourth tank circuits coupled to the collector of said second transistor and to the base of said first transistor, said third tank circuit being resonant at said first frequency, and said fourth tank circuit being resonant at said second frequency, one of said tank circuits being effective, when resonant, to increase the rectified alternating current in the emitter-base circuit of said first transistor and thereby enable said first transistor to conduct current in its emitter-collector path sufficient to energize said operator to open said electrically operated switch and stop said motor.

9. A search-tune system for radio receivers, said system comprising:

a tuner drive motor coupled to the tuner of a radio receiver to drive the radio tuner;

a motor starting circuit including in series a source of electrical energy, a normally-open starting switch, and said motor;

a motor holding circuit including in series said energy source, said motor, and a first normally closed electrically operated motor stopping switch, and a normally open drive motor holding switch;

an operator for said motor stopping switch, said operator being operable, when sufficiently energized, to open said stopping switch for de-energizing said motor to stop drive of the tuner;

a stopping switch control circuit including in series a second source of electrical energy, said operator, and the collector-emitter path of a first transistor;

a control circuit coupled to the base of said first transistor and including in series, the collector-emitter path of a second transistor and a first impedance means;

biasing means coupled to the base electrode of said second transistor;

first and second tank circuits having input means coupled to an intermediate frequency signal source in said radio receiver and having output means coupled to the base of said second transistor, said first tank circuit being resonant at a first predetermined FM intermediate frequency, and said second tank circuit being resonant at a second predetermined AM intermediate frequency, one of said first and second tank circuits, when resonant, producing an output from second transistor to said first transistor to thereby enable sufficient current flow in the emitter-collector path of said first transsitor to sufficiently energize said operator to open said first electrically operated switch and stop said motor.

10. The system of claim 9 and further comprising adjustable biasing means coupled to said second transistor to provide a sensitivity control.

11. The system of claim 9 and further comprising adjustable resistance means in said stopping switch control circuit to provide a sensitivity control.

12. A search-tune system for radio receivers, said system comprising:

a tuner drive motor coupled to the tuner of a radio receiver to drive the radio tuner;

a motor starting circuit including in series a source of electrical energy, a normally open starting switch, and said motor;

a motor holding circuit including in series said energy source, said motor, and a first normally-closed electrically operated motor stopping switch, and a normally open drive motor holding switch;

an operator for said motor stopping switch, said operator being operable, when sufficiently energized, to open said stopping switch for de-energizing said motor to stop drive of the tuner;

a stopping switch control circuit including in series a second source of electrical energy, said operator, and a first signal translating device;

a control circuit coupled to a control electrode of said first signal translating device and including a second signal translating device;

biasing means coupled to said second signal translating device and biasing it into conduction during operation of said motor;

first and second resonant circuit means having input means coupled to a signal source in said radio receiver and having output means coupled to the control electrode of said second signal translating device, said first means being resonant at a first predetermined frequency of signals from said signal source and said second means being resonant at a second predetermined frequency of signals from said signal source, one of said first and second resonant circuit means, when resonant, establishing alternating current signals amplified by said second signal translating device for coupling to said first signal translating device to thereby enable sufficient current flow in said first signal translating device, to sufficiently energize said operator to open said first electrically operated switch and stop said motor.

13. A search-tune system for radio receivers, said system comprising:

tuner drive motor means coupled to the tuner of a radio receiver to drive the radio tuner;

a motor control circuit coupled to said motor means and including a source of electrical energy and a first signal translating device;

a second control circuit coupled to a control electrode of said first signal translating device and including a second signal translating device;

biasing means coupled to said second signal translating device and biasing it into conduction during operation of said motor means;

first and second resonant circuit means having input means coupled to a signal source in said radio receiver and having output means coupled to the control electrode of said second signal translating device, said first means being resonant at a first predetermined frequency of signals from said signal source and said second means being resonant at a second predetermined frequency of signals from said signal source, one of said first and second resonant circuit means, when resonant, establishing alternating current signals ampilfied by said second signal translating device for coupling to said first signal translating device to sufficiently change the current flow in said motor control circuit to stop the tuner at a position where signals at said signal source are at one of said predetermined frequencies.

14. A search-tune system for radio receivers, said system comprising:

tuner drive motor means coupled to the tuner of a radio receiver to drive the radio tuner;

a motor control circuit coupled to said motor means and including a source of electrical energy and a first signal translating device quiescent during radio signal reception when said drive motor means is not operating;

a second control circuit coupled to a control electrode of said first signal translating device and including a second signal translating device;

first resonant circuit means having input means coupled to a signal source in said radio receiver and having output means coupled to the control electrode of said second signal translating device, said resonant circuit means being resonant at a predetermined frequency of signals from said signal source for establishing alternating current signals at said second signal translating device to produce an output to said first signal translating device to establish conduction therein and current flow in said motor control circuit sufficient to stop the tuner at a position where signals at said signal source are at said predetermined frequency.

15. The search-tune system of claim 14 wherein:

said second signal translating device is coupled to an AGC voltage source in said radio receiver to prevent conduction in said second signal translating device until AGC signals in said receiver exceed a predetermined value.

16. The search-tune system of claim 14 wherein:

biasing means are coupled to said second signal translating device normally biasing said second signal translating device non-conducting when said motor means are deenergized.

17. The search-tune system of claim 14 wherein:

said radio receiver has AM/FM band switching means therein;

and first and second adjustable biasing means are coupled to said second signal translating device alternatively through selector switching means connected to said band switching means and operable thereby, to provide one bias setting when said band switching means are set for AM reception and another bias setting when said band switching means are set for FM reception.

18. The search-tune system of claim 14 and further comprising:

audio muting means coupled to audio signal means in said receiver and to said motor means and responsive to energization of said motor means to prevent sound output from said receiver during tuner searching.

References Cited

UNITED STATES PATENTS 2,639,372 5/1953 Colgan ---------- 325—471 XR

KATHLEEN H. CLAFFY, *Primary Examiner.*

R. LINN, *Assistant Examiner.*

UNITED STATES PATENT OFFICE
CERTIFICATE OF CORRECTION

Patent No. 3,382,442

May 7, 1968

Louis F. Mayle

It is certified that error appears in the above identified patent and that said Letters Patent are hereby corrected as shown below:

Column 1, line 24, "translator" should read -- transistor --. Column 7, line 6, "mans" should read -- means --. Column 8, line after "energy" insert -- source --; line 57, "levels" should read -- level --; line 63, "circuit" should read -- circuits --. Column 10, line 60, "transsitor" should read -- transistor --.

Signed and sealed this 23rd day of September 1969.

(SEAL)
Attest:

Edward M. Fletcher, Jr.
Attesting Officer

WILLIAM E. SCHUYLER, JR.
Commissioner of Patents